United States Patent [19]
Theus

[11] Patent Number: 5,285,169
[45] Date of Patent: Feb. 8, 1994

[54] MONOLITHIC INTEGRATED DIFFERENTIAL AMPLIFIER WITH DIGITAL GAIN SETTING

[75] Inventor: Ulrich Theus, Gundelfingen, Fed. Rep. of Germany

[73] Assignee: Deutsche ITT Industries GmbH, Freiburg, Fed. Rep. of Germany

[21] Appl. No.: 929,608

[22] Filed: Aug. 13, 1992

[30] Foreign Application Priority Data

Aug. 24, 1991 [EP] European Pat. Off. ........ 91114232.1

[51] Int. Cl.$^5$ .................................................. H03G 3/30
[52] U.S. Cl. ...................................... 330/254; 330/282; 330/284
[58] Field of Search ................ 330/69, 86, 144, 145, 330/254, 282, 284

[56] References Cited

U.S. PATENT DOCUMENTS

| | | | |
|---|---|---|---|
| 4,064,506 | 12/1977 | Cartwright, Jr. | 340/347 |
| 4,739,281 | 4/1988 | Doyle | 330/253 |

FOREIGN PATENT DOCUMENTS

| | | | |
|---|---|---|---|
| 60-236509 | 4/1986 | Japan. | |
| 133807 | 6/1987 | Japan | 330/284 |

OTHER PUBLICATIONS

Flexible PGA Designs Require Few Components; Akavia Kaniel, Intech, Inc.; 2119 E.D.N. Electrical Design News; 32 (1987) Jan. 22, No. 2, Newton, Mass., USA; pp. 181–183 186–187.

A Programmable Gain/Loss Circuit; Joseph N. Babanezhad, Member, IEEE, and Roubik Gregorian, Senior Member, IEEE; IEEE Journal of Solid-State Circuits, vol. SC-22, No. 6, Dec. 1987; pp. 1082–1089.

Primary Examiner—James B. Mullins
Attorney, Agent, or Firm—Thomas L. Peterson

[57] ABSTRACT

The present invention is a monolithic integrated differential amplifier having an operational amplifier and a digitally controlled means for setting the gain of said differential amplifier wherein the gain is adjustable by means of a resistive feedback network formed by a resistor chain whose taps are coupled via a multiplexer to the operational amplifier. The operational amplifier in the present invention is designated as an adaptive amplifier because its gain-bandwidth product is digitally adjustable in steps, with the respective gain-bandwidth product selected being adapted to the gain setting of the monolithic integrated differential amplifier.

18 Claims, 2 Drawing Sheets

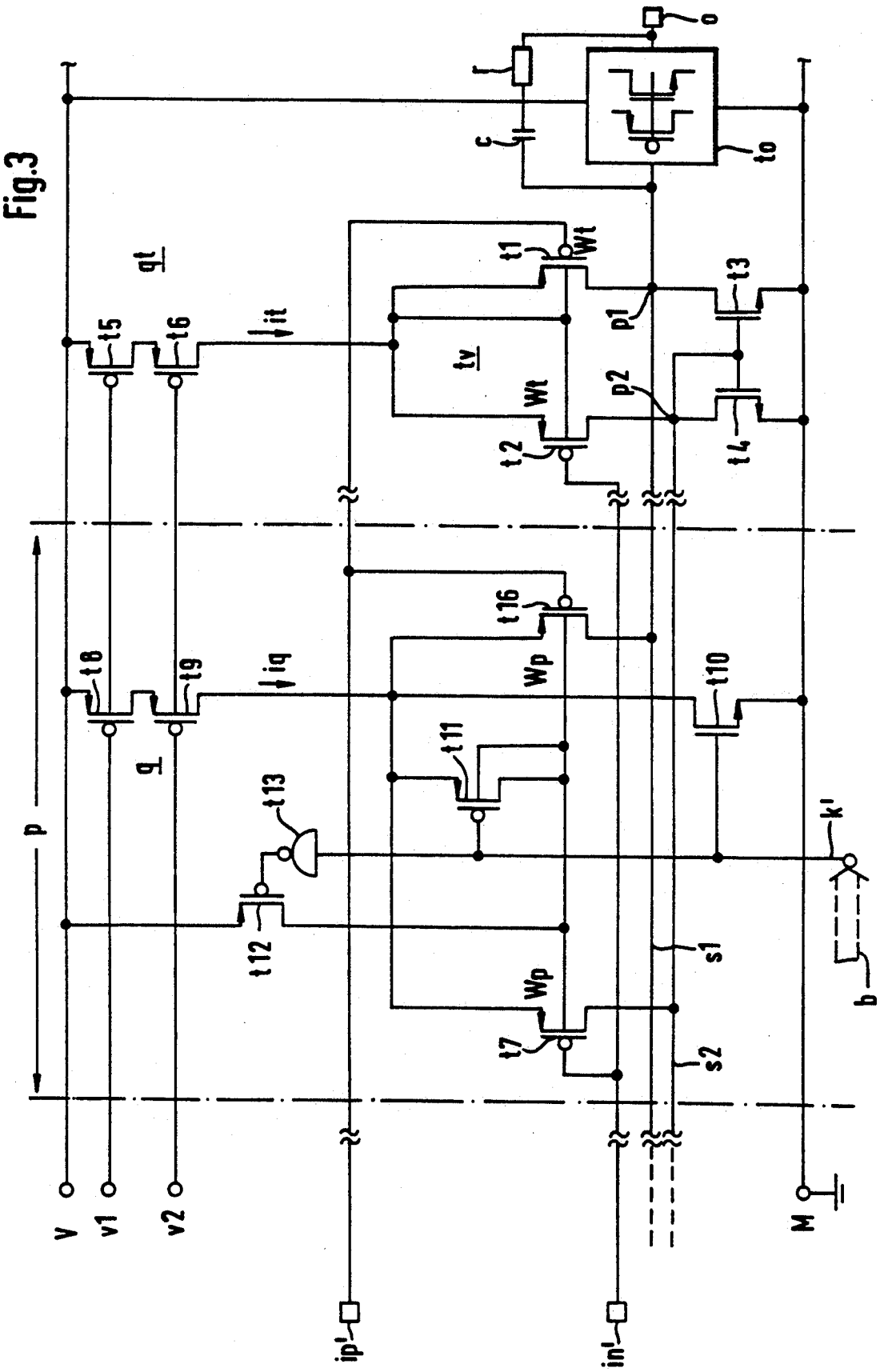

MONOLITHIC INTEGRATED DIFFERENTIAL AMPLIFIER WITH DIGITAL GAIN SETTING

FIELD OF THE INVENTION

The present invention relates to differential amplifiers and more particularly to a monolithic integrated differential amplifier whose gain can be digitally adjusted over a wide bandwidth.

BACKGROUND OF THE INVENTION

Monolithic integrated circuits with digital gain setting are commonly used to control the gain of analog signals. The ability to control the gain of an analog signal is particularly important if the analog signal is to be digitized by means of an analog-to-digital converter and if the analog signal varies widely in amplitude. Without the ability to control the gain of analog signals, digital resolution of such signals would be greatly reduced at small amplitudes.

The ability to digitally adjust the gain of integrated circuits and amplifiers is well-known in the art. In "IEEE A Journal of Solid-State Circuits" Vol. SC-22, No. 6, December 1987, pages 1082 to 1089, an article entitled "A Programmable Gain/Loss Circuit" describes in detail a monolithic integrated circuit which can be switched in gain or loss via a data input. The circuit, which is implemented in CMOS technology, contains an operational amplifier and a resistive feedback network formed by a chain of resistors whose taps can be connected individually via a 1-out-of-n switch (=multiplexer) to the inverting amplifier input. The ratio of the feedback resistance to the input resistance, and hence the gain setting of the monolithic integrated circuit depends on the tapping point chosen. One disadvantage of this prior art arrangement is that the gain-bandwidth product is fixed by the operational amplifier, usually for the most unfavorable case of full negative feedback. This reduces the bandwidth for all other gains. The higher the adjusted gain, the narrower the attainable bandwidth.

It is, therefore, a primary objective of the present invention to provide a monolithic integrated circuit whose gain is adjustable over a wide bandwidth range and which does not suffer form the disadvantages that its bandwidth is limited by a fixed gain-bandwidth product.

SUMMARY OF THE INVENTION

The present invention is a monolithic integrated differential amplifier having an operational amplifier and a digitally controlled means for setting the gain of said differential amplifier wherein the gain is adjustable by means of a resistive feedback network formed by a resistor chain whose taps are coupled via a multiplexer to the input of the operational amplifier.

The operational amplifier in the present invention is designated as an adaptive amplifier because its gain-bandwidth product is digitally adjustable in steps, with the respective gain-bandwidth product selected being adapted to the gain setting of the monolithic integrated differential amplifier. Said adaptation is effected by a simple digital assignment of the gain-bandwidth product setting to individual gain ranges defined by a digital control signal for the multiplexer. The gain-bandwidth product of said adaptive amplifier is determined, in part, from the value of the transconductance of a differential stage of a transconductance amplifier contained in said operational amplifier, which value is variable by means of at least one paralleling stage.

BRIEF DESCRIPTION OF THE FIGURES

For a better understanding of the present invention, reference is made to the following description of an exemplary embodiment thereof, considered in conjunction with the accompanying drawings, in which:

FIG. 3 is a circuit diagram of an exemplary embodiment of the adaptive amplifier in CMOS technology.

DETAILED DESCRIPTION OF THE DRAWINGS

Figure 1:
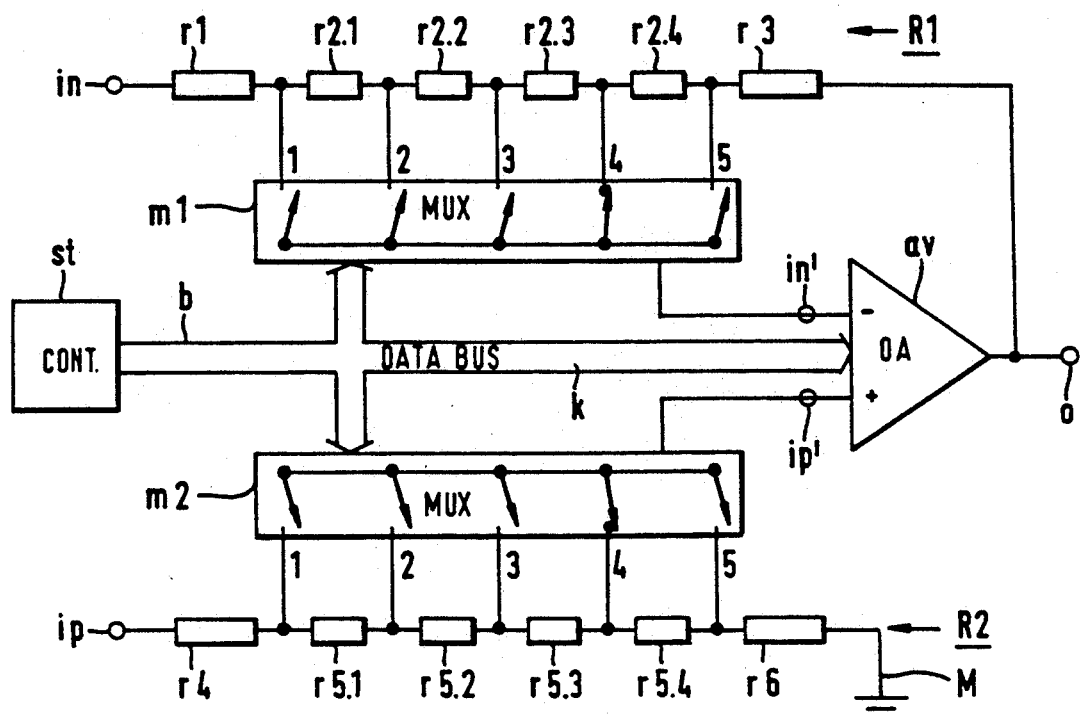
FIG. 1 is a block diagram of one exemplary embodiment of the digitally adjustable differential amplifier in accordance with the invention.

Referring to FIG. 1, there is shown an exemplary embodiment of the present invention wherein an inverting input in is connected to a first resistor chain R1 having the resistive elements r1, r2.1, r2.2, r2.3, r2.4 and r3, and wherein a noninverting input ip is connected to a second resistor chain R2 having the resistive elements r4, r5.1, r5.2, r5.3, r5.4 and r6. The resistive elements of each resistor chain are separated by taps.

Each of the taps between the individual resistive elements of the first resistor chain R1 is connected to one of the inputs, 1, 2, 3, 4, 5, of a first multiplexer m1 (MUX) and each of the taps between the resistive elements of the second resistor chain R2 is connected to one of the inputs, 1, 2, 3, 4, 5, of a second multiplexer m2 (MUX).

The outputs of the first and second multiplexers m1 and m2 are coupled to the inverting and noninverting inputs, in' and ip' respectively, of an adaptive amplifier av. The output terminal o of the adaptive amplifier av is connected to the end of the first resistor chain R1 opposite the inverting input in. The end of the second resistor chain R2 opposite the noninverting input ip is connected to a fixed reference potential M.

A controller (CONT.) st, which may form part of a digital amplitude control circuit which is not shown, is connected to a data bus b which is in turn connected to the two multiplexers m1 and m2 and to the adaptive or operational amplifier (OA) av. The controller st feeds the data bus b with a data signal which is applied to the adaptive amplifier av and which also switches the two multiplexers m1 and m2 according to the gain desired. The operational or adaptive amplifier av is also supplied with those control signals k which are necessary to switch the gain-bandwidth product.

In FIG. 1, the switches 4 are closed, while all the other switches are open. Consequently, the tap between the resistive elements r2.3 and r2.4 of the first resistor chain R1 is connected to the inverting input in', and the tap between the resistive elements r5.3 and r5.4 of the second resistor chain R2 is connected to the noninverting input ip'. In this manner the ratio of the feedback resistance to input resistance in the two signal paths, and hence the gain is determined.

Figure 2:
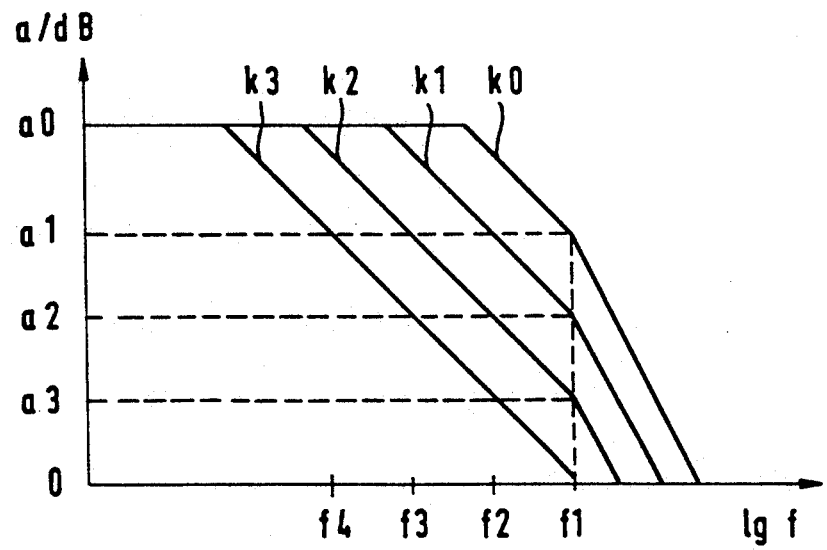
FIG. 2 is a graph showing the adjustable frequency response of an exemplary embodiment of the adaptive amplifier contained in the present invention.

In FIG. 2, the different frequency-response curves of an exemplary embodiment of the adaptive amplifier av of FIG. 1 are shown schematically in a double-logarithmic representation where the horizontal axis represents frequency f, and the vertical axis represents gain a.

Curve k3 shows the 20-db/decade loss of gain with complete frequency compensation. As the gain of the adaptive amplifier av increases, the associated bandwidth over which the adaptive amplifier can operate decreases. At full negative feedback a=0dB, curve k3 shows that the frequency f1 is reached. At the gain a1, curve k3 shows that the bandwidth decreases to the frequency f4.

The frequency response curve k2 shows the adaptive amplifier av with an increased gain-bandwidth product as compared to the gain-bandwidth product associated with curve k3. Curve k2 shows that as compared to curve k3, the available bandwidth over which the adaptive amplifier av can operate is widened at the gains a1, a2 and a3. Curve k2 also shows that full negative feedback is no longer possible in the frequency range f4 to f1 since in this frequency range the frequency reduction shown is greater than 20 dB/decade.

Frequency-response curves k1 and k0 show that the adaptive amplifier av can operate over even greater bandwidths than shown by curves k3 and k2 so long as the gain is set no lower than a2 for curve k1 and a1 for curve k0.

FIG. 3 shows an exemplary embodiment of the adaptive amplifier av of FIG. 1 in CMOS technology, wherein the adaptive amplifier has an input stage consisting of a first transconductance amplifier tv whose differential stage is formed by a pair of p-channel transistors t1 and t2 whose interconnected source terminals are supplied with a first source current (it) form a first current source qt including series FETs t5 and t6. The gate terminals of the transistors t1 and t2 form the noninverting and inverting inputs, ip' and in' respectively, of the adaptive amplifier av. The input connections of the noninverting and inverting inputs, ip' and in' respectively, are designed as long collecting leads because the input stages of a number of paralleling stages p, of which a single one is shown as an example in FIG. 3, have to be connected to these leads.

The drain current of the transistor t2 of the first transconductance amplifier tv is supplied to the input of an n-channel current mirror consisting of transistors t3 and t4. The output of this current mirror and the drain terminal of the transistor t1 of the first transconductance amplifier tv form the first node p1. The junction of the drain terminals of the transistors t2 and t4 form the second node p2. The first and second nodes p1 and p2 are connected to first and second current rails, s1 and s2 respectively, which supply to the two nodes p1 and p2 the drain current from paralleling stages p which have been activated. The first node p1 represents the output of the first transconductance amplifier tv, which output is coupled to the input of a second transconductance amplifier to which serves as a push-pull output driver stage and is connected to the output terminal o. Advantageous class-A/B push-pull CMOS output stages are described, for example, in "A Journal of Solid-State Circuits", Vol. SC-22, No. 6, December 1987, pages 1082 to 1089. A particularly advantageous embodiment is also the subject matter of European Patent Application 90 11 0765.6.

A negative-feedback network consisting of a resistor r in series with a capacitor c is connected between the output terminal o and the first node p1. This negative-feedback network of r and c, in conjunction with the first and second transconductance amplifiers, tv and to respectively, will cause a 20-dB/decade frequency reduction of the open-loop gain of the adaptive amplifier av if negative feedback down to the gain O dB is to be provided. The associated gain-bandwidth product follows form the value of both the first source current it and the transconductance of the differential stage, t1 and t2, with the channel width Wt and the channel length Lt of the transistors t1 and t2 entering into the product as essential quantities.

The transconductance of the first transconductance amplifier tv can be varied by increasing or decreasing both the channel width Wt of the transistors t1 and t2 and the first source current it in the same proportion. This is made possible by the parallel stages p, which connect the p-channel transistors t16 and t7 in parallel with the p-channel transistors t1 and t2 of the differential stage, the transistors t16 and t7 being as identical to the transistors t1 and t2 as possible, and the ratio of the first source current it to the second source current iq being equal to the ratio of Wt, the channel width of the common source terminal of the transistors t1 and t2, to Wp, the channel width of the transistors t16 and t7. The second current source q in the respective paralleling stage p, supplies a second source current iq to the interconnected source terminals of the p-channel transistors t16 and t7. To ensure that the transistors t16 and t7 are as nearly identical to the transistors t1 and t2 as possible, the channel length Lt of the transistors t1 and t2 and the channel length Lp of the transistors t16 and t7 are equal to one another.

The gate terminals of the p-channel transistors t16 and t7 are connected by the above-described long connecting leads to the inverting and noninverting inputs, ip' and in' respectively. The drain terminal of the transistor t16 is connected to the first node p1 by the first current rail s1, and the drain terminal of the transistor t7 is connected to the second node p2 by the second current rail s2.

To avoid the undesired increases of the threshold voltages of the p-channel transistors t1 and t2 commonly associated with the usual connection of the n-wells of such transistors to the positive supply potential V, the n-wells of such transistors are instead tied to the common source potential of the transistors t1 and t2. This alternative connection for providing potential to the n-wells of the transistors also keeps the transconductance of the first transconductance amplifier tv independent of the DC level at the two inputs ip' and in'. For identical reasons, the n-wells of the p-channel transistors t16 and t7 are similarly connected to the common source potential of the transistors t16 and t7. This alternative connection is however only applicable if the paralleling stage p is activated as has been thus far described.

If the paralleling stage p is not activated, the n-well potential of the transistors t16 and t7 will be switched to the positive supply terminal V by means of a p-channel transistor t12. In addition, and at the same time, the path between the n-well terminals and the common source potential of the transistors t16 and t7 is opened via a p-channel transistor t11, and the current iq from the second current source q is caused to flow to the reference-voltage terminal M by means of an n-channel transistor t10. This switching operation, by which the paralleling stage is either activated or disabled, is caused by a 1-bit control signal k' which is fed to the respective paralleling stage p via the data bus b. In order for the p-channel transistors t11 and t12 to switch oppositely, the 1-bit control signal k' is inverted ahead of the gate terminal of the transistor t12 by means of an invertor t13.

By means of the aforementioned switching facility in each paralleling stage p, optimum identity to the differential stage t1 and t2 is achieved for each activated paralleling stage p. In the paralleling stages p which are not activated, the individual potentials are switched so that their effect on both the differential stage t1 and t2 and the current sources qt and q is minimized. The paralleling stages p which are switched so that they are not activated react on the jointly controlled current sources qt and q by means of the current discharge through the transistor t10 and the cascode connection of the current sources qt and q. The first current source qt, formed by the cascode connection of the p-channel transistors t5 and t6 is controlled by a first and a second bias voltage v1 and v2 respectively. The second current source q, formed by the cascode connection of the p-channel transistors t8 and t9 is also controlled by the first and the second bias voltage v1 and v2.

It will be understood that the embodiment described herein is merely exemplary and that a person skilled in the art may make many variations and modifications to the described embodiment utilizing functionally equivalent elements to those described. More specifically, it should be understood that any digital control means can be used in place and instead of the means described herein. Any variations or modifications to the invention just described are intended to be included within the scope of said invention as defined by the appended claims.

What is claimed is:

1. A differential amplifier having means for adjusting the gain over a wide bandwidth, comprising:
   first and second resistor chains, each chain having a plurality of resistive elements separated by taps, said first chain having a first chain input terminal and a first chain output terminal and said chain having a second chain input terminal and a second chain output terminal;
   a first multiplexer having a plurality of inputs and a first common output terminal, each input coupled to an associated one of said taps of said first resistor chain, wherein any desired one of said inputs can be selected to couple to said first common output terminal of said fist multiplexer;
   a second multiplexer having a plurality of inputs and a second common output terminal, each input coupled to an associated one of said taps of said second resistor chain, wherein any desired one of said inputs can be selected to couple to said second common output terminal of said second multiplexer;
   an operational amplifier having an inverting input terminal, a noninverting input terminal and an amplifier output terminal, wherein said inverting input terminal is coupled to said first common output terminal of said first multiplexer, said noninverting input terminal is coupled to said second common output terminal of said second multiplexer, said amplifier output terminal is coupled to said first chain output terminal of said first resistor chain and said second chain output terminal of said second resistor chain is coupled to ground; and
   control means further coupled to said first and second multiplexers and said operational amplifier, wherein said control means switches said first and second multiplexers to couple at least one of said taps in each of said first and second resistor chains to said inverting and noninverting input terminals of said operational amplifier to achieve a desired gain, and switches the gain-bandwidth product of said operational amplifier according to said taps selected, thereby causing said operational amplifier to operate over a wide-bandwidth irrespective of its gain.

2. The differential amplifier according to claim 1, wherein:
   said operational amplifier has a feedback resistance between said amplifier output terminal and said first chain output terminal of said first resistor chain, and a variable input resistance at said inverting input terminal of said operational amplifier determined by said taps selected by said first multiplexer; and
   the gain of said operational amplifier is determined by the ratio of said feedback resistance to said variable input resistance.

3. The differential amplifier according to claim 1, wherein said first and second resistor chains have five resistive elements.

4. The differential amplifier according to claim 1, wherein said differential amplifier is implemented in CMOS Technology.

5. The differential amplifier according to claim 1, wherein said operational amplifier comprises:
   a first transconductance amplifier as an input stage;
   a second transconductance amplifier as an output stage, said second transconductance amplifier including an input terminal and an output terminal, said second transconductance amplifier being coupled to said first transconductance amplifier; and
   a negative feedback network coupled between said input terminal and said output terminal of said second transconductance amplifier, wherein said negative feedback network determines the frequency response of said operational amplifier.

6. The differential amplifier according to claim 5, wherein a differential stage of said first transconductance amplifier comprises:
   a first p-channel transistor; and
   a second p-channel transistor coupled to said first p-channel transistor by a common source terminal, wherein said common source terminal is supplied with a first source current.

7. The differential amplifier according to claim 6, wherein said first p-channel transistor and said second p-channel transistor have fixed channel lengths and fixed channel widths.

8. A differential amplifier having means for adjusting the gain over a wide bandwidth, comprising:
   an operational amplifier having an input terminal and an output terminal, wherein said operational amplifier includes:
      a first transconductance amplifier as an input stage, said first transconductance amplifier further including a differential stage comprising a first p-channel transistor and a second p-channel transistor coupled to said first p-channel transistor by a common source terminal, wherein said common source terminal is supplied with a first source current, said first p-channel transistor and said second p-channel transistor have fixed channel lengths and fixed channel widths, wherein the transconductance of said first transconductance amplifier is variable in steps by means of at least one paralleling stage which is identical in design to said differential stage of said first transconductance amplifier;

a second transconductance amplifier as an output stage, said second transconductance amplifier including an input terminal and an output terminal, said second transconductance amplifier being coupled to said first transconductance amplifier; and a negative feedback network coupled between said input terminal and said output terminal of said second transconductance amplifier, wherein said negative feedback network determines the frequency response of said operational amplifier;

a switching means coupled to said input terminal of said operational amplifier for varying the resistance appearing at said input terminal of said operational amplifier; and an adjusting means coupled to said switching means for varying the gainbandwidth product of said operational amplifier according to the input resistance selected by said switching means.

9. The differential amplifier according to claim 8, wherein said paralleling stage comprises:
a third p-channel transistor; and
a fourth p-channel transistor coupled to said third p-channel transistor by a common source terminal, wherein said common source terminal is supplied by a second source current.

10. The differential amplifier according to claim 9, wherein said third p-channel transistor and said fourth p-channel transistor have fixed channel lengths and fixed channel widths.

11. The differential amplifier according to claim 10, wherein:
the channel length of said third and fourth p-channel transistors of said paralleling stage is equivalent to the channel length of said first and second p-channel transistors of said differential stage; and
the ratio of the channel width of said third and fourth p-channel transistors of said paralleling stage to the channel width of said first and second p-channel transistors of said differential stage is equivalent to the ratio of said second source current to said first source current.

12. A differential amplifier, comprising:
first and second resistor chains, each chain having a plurality of resistive elements separated by taps, said first chain having a first chain input terminal and a first chain output terminal and said second chain having a second chain input terminal and a second chain output terminal;

a first switching means having a plurality of inputs, each input coupled to an associated one of said taps of said first resistor chain, wherein any desired one of said inputs can be selected to couple to a first common output terminal of said first switching means;

a second switching means having a plurality of inputs, each input coupled to an associated one of said taps of said second resistor chain, wherein any desired one of said inputs can be selected to couple to a second common output terminal of said second switching means;

an operational amplifier having an inverting input terminal, a noninverting input terminal, and an amplifier output terminal, wherein said inverting input terminal is coupled to said first common terminal of said first switching means, said noninverting input terminal is coupled to said second common terminal of said second switching means, and said amplifier output terminal is coupled to said first chain output terminal of said first resistor chain;

control means further coupled to said first and second switching means and said operational amplifier, wherein said control means switches said first and second switching means to couple at least one of said taps in each of said first and second resistor chains to said inverting and noninverting input terminals of said operational amplifier to achieve a desired gain, and switches the gain-bandwidth product of said operational amplifier according to said taps selected, thereby causing said operational amplifier to operate over a wide-bandwidth irrespective of its gain.

13. The differential amplifier according to claim 12, wherein said first and said second switching means are multiplexers.

14. The differential amplifier according to claim 13, wherein:
said operational amplifier comprises a first transconductance amplifier as an input stage, a second transconductance amplifier as an output stage, and a negative-feedback network for determining a frequency response; and
a transconductance of said first transconductance amplifier being variable in steps by means of at least one paralleling stage which is identical in design to a differential stage of said first transconductance amplifier.

15. The differential amplifier according to claim 14, wherein said differential amplifier is implemented in CMOS technology.

16. The differential amplifier according to claim 15, wherein:
said differential stage of said first transconductance amplifier contains a first p-channel transistor and a second p-channel transistor whose common source terminal is supplied with a first source current and whose channel width and channel length are fixed;
a paralleling stage contains a third p-channel transistor and a fourth p-channel transistor whose common source terminal is supplied with a second source current and whose channel width and channel length are fixed;
the channel length of said third and fourth p-channel transistors of said paralleling stage is equivalent to the channel length of said first and second p-channel transistors of said differential stage; and
the ratio of the channel width of said third and fourth p-channel transistors of said paralleling stage to the channel width of said first and second p-channel transistors of said differential stage is equivalent to the ratio of said second source current to said first source current.

17. The differential amplifier according to claim 16, where, in all activated paralleling stages, respective n-wells of said third and fourth p-channel transistors are connected via switching devices to respective source potentials of said third and fourth p-channel transistors, and in all nonactivated paralleling stages, the n-wells of said third and fourth p-channel transistors are connected to a high supply potential.

18. The differential amplifier according to claim 16, said operational amplifier further including a reference-potential terminal, where, in all nonactivated paralleling stages, said second source current is switched to the reference-potential terminal.

* * * * *